(12) United States Patent
Franco et al.

(10) Patent No.: US 8,030,959 B2
(45) Date of Patent: Oct. 4, 2011

(54) DEVICE-UNDER-TEST POWER MANAGEMENT

(75) Inventors: Osvaldo Franco, Apex, NC (US); Robert W. Milhaupt, Bloomingdale, IL (US); Daniel J. Cooper, Woodstock, IL (US)

(73) Assignee: Texas Instruments Incorporated, Dallas, TX (US)

( * ) Notice: Subject to any disclaimer, the term of this patent is extended or adjusted under 35 U.S.C. 154(b) by 747 days.

(21) Appl. No.: 12/138,098

(22) Filed: Jun. 12, 2008

(65) Prior Publication Data

US 2009/0309556 A1 Dec. 17, 2009

(51) Int. Cl. *G01R 31/26* (2006.01)
(52) U.S. Cl. ............................. 324/762.01; 324/750.3
(58) Field of Classification Search .................. None
See application file for complete search history.

(56) References Cited

U.S. PATENT DOCUMENTS

| | | | |
|---|---|---|---|
| 5,619,462 A * | 4/1997 | McClure | 365/201 |
| 6,298,370 B1 | 10/2001 | Tang et al. | |
| 6,339,338 B1 * | 1/2002 | Eldridge et al. | 324/754.03 |
| 6,526,464 B1 | 2/2003 | Jobs et al. | |
| 6,611,537 B1 | 8/2003 | Edens et al. | |
| 6,789,030 B1 | 9/2004 | Coyle et al. | |
| 6,816,750 B1 | 11/2004 | Klaas | |
| 7,028,215 B2 | 4/2006 | Depew et al. | |
| 7,031,401 B2 | 4/2006 | Lambert | |
| 7,039,918 B2 | 5/2006 | Jones et al. | |
| 7,072,975 B2 | 7/2006 | Kato | |
| 7,307,433 B2 * | 12/2007 | Miller et al. | 324/756.03 |
| 2003/0210686 A1 | 11/2003 | Terrell et al. | |
| 2006/0242437 A1 | 10/2006 | Jovanovich | |
| 2007/0038516 A1 | 2/2007 | Apple et al. | |

* cited by examiner

*Primary Examiner* — Minh N Tang
(74) *Attorney, Agent, or Firm* — Yingsheng Tung; Wade J. Brady, III; Frederick J. Telecky, Jr.

(57) ABSTRACT

One embodiment of the present invention includes a system for managing power to a plurality of devices-under-test (DUTs). The system comprises a DUT test system configured to perform at least one test associated with operation of the DUTs and to monitor current associated the at least one test of the plurality of DUTs. The DUT test system can communicate an instruction to a subset of the plurality of DUTs to cancel the at least one test if the monitored current is greater than a predetermined threshold. Each of the plurality of DUTs can comprise restart logic configured to restart the at least one test of the subset of the plurality of DUTs after being cancelled in response to the instruction.

22 Claims, 6 Drawing Sheets

DEVICE-UNDER-TEST POWER MANAGEMENT

TECHNICAL FIELD

This invention relates to electronic circuits, and more specifically to device-under-test (DUT) power management.

BACKGROUND

To maintain product quality, manufacturers of semiconductor devices perform tests on their products prior to shipment to consumers. During testing, one or more devices-under-test (DUTs) are stimulated by signals from automatic test equipment (ATE) which is configured to receive and analyze the responses from the DUTs. As an example, DUTs can include dies on a wafer or integrated circuit (IC) chips. Testing for a given set of DUTs is typically performed in parallel, such that a given test is performed concurrently from start to finish for each DUT in the given set. As a result, a large number of DUTs can be tested in a relatively short amount of time.

To perform tests on a given set of DUTs, a DUT test system provides operating power to the DUTs. The DUTs are thus able to perform their test functions using the operating power that is supplied to them. Accordingly, a power supply on the DUT test system is sized according to the current requirements of the DUTs for which the DUT test system is conducting the test functions. However, during a given test, or from one test to another, the power requirements of a given DUT often changes. For example, a given test can have multiple stages, with some of the stages requiring greater amounts of current than others. As a result, the power supply of the DUT test system can typically be sized according to the worst case scenario of the current draw of the tests. Therefore, for less current intensive tests or test stages, power supply capacity can be largely unused, resulting in an inefficiency of the test process.

SUMMARY

One embodiment of the present invention includes a system for managing power to a plurality of devices-under-test (DUTs). The system comprises a DUT test system configured to perform at least one test associated with operation of the DUTs and to monitor current associated with the at least one test of the plurality of DUTs. The DUT test system can communicate an instruction to a subset of the plurality of DUTs to cancel the at least one test if the monitored current is greater than a predetermined threshold. Each of the plurality of DUTs can comprise restart logic configured to restart the at least one test of the subset of the plurality of DUTs after being cancelled.

Another embodiment of the present invention includes a method for managing power to a plurality of DUTs. The method comprises monitoring a current associated with at least one test of each of the plurality of DUTs. The method also comprises canceling the at least one test for a subset of the plurality of DUTs in response to the current exceeding a predetermined threshold, and individually restarting the at least one test for the subset of the plurality of DUTs based on a random heuristic algorithm.

Another embodiment of the present invention includes a system for managing power to a plurality of DUTs. The system comprises means for monitoring a test current associated with at least one test of each of the plurality of DUTs. The system also comprises means for removing the test current from a subset of the plurality of DUTs upon the test current exceeding a predetermined threshold. The system further comprises means for selecting the subset based on an elapsed time that each of the plurality of DUTs has individually performed the at least one test.

DETAILED DESCRIPTION

The present invention relates to electronic circuits, and more specifically to device-under-test (DUT) power management. In the embodiments described herein, DUTs may not be tested in parallel, such that tests that are conducted across the DUTs are not necessarily started and completed at the same time from one DUT to another. A DUT test system monitors current draw associated with the DUTs for which the tests are conducted. Upon the monitored current being greater than a predetermined threshold, the DUT test system can command cancellation of the tests of a subset of the plurality of DUTs. The cancellation of the tests can occur based on the DUT test system decoupling the power to the subset of the DUTs. Alternatively, the DUT test system can cancel the tests by a broadcast to the subset of the DUTs commanding the subset of the DUTs to disconnect from the supplied power. The subset of the DUTs can be selected based on an elapsed time at which each of the DUTs has been conducting its respective test. As an example, tests that have only been conducted for a short amount of time may be cancelled, such that tests that have been substantially completed can be continued to maintain efficiency for the test process.

Upon cancellation of testing for the subset of the DUTs, the DUTs can be configured to restart the testing independently of the DUT test system and each other. In addition, both the starting and restarting of the testing can be based on a random heuristic algorithm, such that the additional current draw of the subset of the DUTs, upon both starting and restarting the tests, can be substantially staggered. As a result, the current draw can be gradually increased to allow the total monitored current to all of the DUTs to be effectively managed. As described herein, it is to be understood that the random heuristic algorithm can be implemented as an operational trial that is based on a set of random parameters, such that a range of the random parameters can be adjusted based on the results of the trial.

Based on the examples and embodiments herein regarding testing of the DUTs, a very large number of DUTs (e.g., one thousand or more) can be tested in a single test sequence. Specifically, the very large number of DUTs can be tested by a DUT test system in such a manner as to minimize both time and contact with the DUTs based on providing some operational power and actively managing power provided to the DUTs via non-essential power rails. Therefore, the very large number of DUTs can be all be enabled and ready to receive a test that is to be run at a future time without exceeding power limitations based on the random heuristic algorithms.

Figure 1:
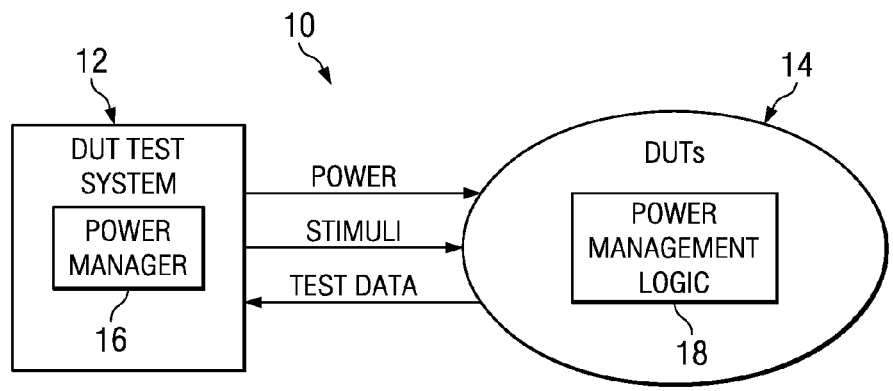
FIG. 1 illustrates an example of a test system in accordance with an aspect of the invention.

FIG. 1 illustrates an example of a test system 10 in accordance with an aspect of the invention. The test system 10 can be included in any of a variety of testing environments. The test system 10 includes a DUT test system 12 and a plurality of DUTs 14. The DUTs 14 can be any of a variety of electronic devices for which testing may be necessary prior to distribution. For example, the DUTs 14 can be assorted semiconductor dies on a wafer, or can be packaged integrated circuits (ICs). For a given test sequence, the number of DUTs 14 can be substantial, such as greater than one-thousand.

The DUT test system 12 is configured to make physical contact with the DUTs 14 in order to conduct one or more tests of the DUTs 14. As an example, the DUT test system 12 can include a prober and/or a handler that is configured to make physical contact with conductive terminals of each of the DUTs 14 to provide electrical coupling with the respective DUTs 14. The DUT test system 12 can thus provide power to the DUTs 14, demonstrated in the example of FIG. 1 as the signal POWER, such that the DUTs 14 can function and/or simulate typical operating features. In addition, the DUT test system 12 can also provide test stimuli to the DUTs 14, demonstrated in the example of FIG. 1 as the signal STIMULI. As an example, the test stimuli can include one or more test programs that are downloaded to each of the DUTs 14, such that the DUTs 14 can perform the downloaded test programs either individually or in response to additional stimuli that is provided from the DUT test system 12. As another example, the DUTs 14 can be designed to include fixed test programs, such that the stimuli provided from the DUT test system 12 can be provided at inputs of each of the DUTs 14 to simulate typical operating conditions of the respective DUTs 14.

The DUTs 14 can respond to the stimuli and power with test data, indicated in the example of FIG. 1 as the signal TEST DATA. As an example, the test data can include outputs that are responsive to the stimuli and power, such that the DUT test system 12 can determine if each of the DUTs 14 is operating properly. As an example, the DUTs 14 can respond to stimuli with expected test data, or can indicate that it is a rejected component, such that the test data is unacceptable for a given set of stimuli. As another example, the test data can include a signal that is an indication that one or more of the DUTs 14 have completed a test, and/or that a completed test was successful or was a failure. Furthermore, the tests that are performed on the DUTs 14 can be digital or analog tests, such that the test data that is provided from each of the DUTs 14 can include analog components and/or digital components.

As described above, some tests that are conducted by the DUT test system 12 on the DUTs 14, or some stages of a given test, can require more power than others. As a result, the current that is provided from the DUT test system 12 to the DUTs 14 in the signal POWER can vary depending on the type or stage of test that is being conducted by the DUTs 14, and as described in greater below, depending also on the number of DUTs 14 that are being tested at a given time. However, a power supply (not shown) in the DUT test system 12 that provides the power to the DUTs 14 can have a static maximum current rating. As a result, the test system 10 can be configured such that the number of DUTs 14 that are being tested at a given time can be variable to maximize the use of the current output of the DUT test system 12. Therefore, the test system 10 can be significantly more efficient than typical test systems by ensuring that the maximum number of DUTs 14 are tested at a given time to maximize the current output capability of the DUT test system 12. Accordingly, a large number of DUTs can be tested in a single test session, and can be tested much more quickly and efficiently than testing the same number of DUTs 14 using a typical test system.

The DUT test system 12 includes a power manager 16. The power manager 16 can be configured to monitor the current that is drawn by the DUTs 14 during testing. Upon the monitored current exceeding a predetermined threshold, the power manager 16 can communicate an instruction to a subset of the DUTs 14 to cancel the test which the DUTs 14 in the subset are performing. As an example, the instruction can be communicated by the power manager 16 by broadcasting a cancellation signal to each of the DUTs 14 in the set, with the broadcasted signal providing information regarding which specific DUTs 14 are to form the subset that cancels their respective tests. As another example, the instruction can be communicated merely by momentarily decoupling a power source provided to the respective DUTs 14 in the subset that is implemented for the test, such that the tests of the respective subset are cancelled. As a result, the current that is drawn by the DUTs 14 that are conducting the tests can be reduced, such that the current provided to the DUTs 14 can be controlled to within a narrow range that is near the maximum current providing capacity of the DUT test system 12.

Each of the DUTs 14 can include power management logic 18. The power management logic 18 can work in conjunction with the power manager 16 to maximize the number of DUTs 14 that are being tested at a given time based on the current drawn by the set of DUTs 14. As an example, the power management logic 18 of each of the DUTs 14 can receive a broadcast signal provided from the power manager 16 if the output current of the DUT test system 12 exceeds a predetermined threshold. The power management logic 18 can thus determine if the test for the respective DUT 14 should be cancelled to reduce the collective current that is drawn by the set of DUTs 14. As an example, the determination of whether a given DUT 14 should cancel its test can be based on an elapsed time that the set of DUT 14 has been conducting its test. Specifically, if a DUT 14 has just begun a test, canceling that test would not result in a significant loss of test time for the set of DUTs 14 as a whole. However, if a DUT 14 has been conducting a test for a substantial amount of time, then canceling the test could result in an inefficient loss of testing time for the DUTs 14 as a whole. If the power management logic 18 determines that the respective DUT 14 should cancel its test, the power management logic 18 can decouple the DUT 14 from the current that is provided by the DUT test system 12.

Upon canceling the test for the respective DUTs 14, the power management logic 18 for such DUTs can include restart logic that is configured to autonomously restart the testing after testing has been cancelled. For example, each DUT 14 can include logic configured to implement a random heuristic algorithm to restart the test for the DUT 14 after being cancelled independently of the DUT test system 12. As an example, the power management logic 18 can begin incrementing a back-off timer upon canceling the test. Upon the incremented value of the back-off timer achieving a preset value, the power management logic 18 can command the respective DUT 14 to restart the test. In addition, the preset time for the back-off timer can be set by the power management logic 18. As one example, the preset time can be randomly or otherwise set such that the subset of the DUTs 14 that cancelled their test concurrently do not all restart their respective tests concurrently, thus mitigating the amount of inrush current that is drawn from the DUT test system 12.

As a further example, the restart logic for the DUTs 14 having cancelled tests can reside entirely within the power manager 16, or a combination of the power manager 16 and the power management logic 18 of the DUTs 14 having cancelled tests. As an example, the DUT test system 12 can exchange one or more additional digital and/or networked signals between each of the DUTs 14 in the set. As a result, the power manager 16 can initiate a restart of the tests of one or more DUTs 14 having cancelled tests, for example, by maintaining a random heuristic algorithm for each of the DUTs 14 having cancelled tests, such as indicated to the power manager 16 via the signal TEST DATA.

As another example, the power management logic 18 of each of the DUTs 14 can include a back-off timer that includes random number scaling or random number starting counts, such that the power manager 16 can provide a signal to all the DUTs 14 in the set commanding a restart for each of the DUTs 14 having an accumulated back-off timer count that exceeds a value provided in the signal to the DUTs 14. As yet another example, the power management logic 18 in each of the DUTs 14 can be obviated, such that all of the test cancellation and restart capability is provided in the power manager 16. For instance, the power manager 16 can be configured to estimate power consumption for a given test that is performed by the DUTs 14. As such, the power manager 16 can selectively activate and/or stagger activation of a subset of the DUTs 14 to perform the given test, such as based on the estimated power consumption, the number of DUTs 14 that have completed the given test, and/or random heuristics derived within the power manager 16.

As a result of the collective operation of the power manager 16 and the power management logic 18 of each of the DUTs 14, the test system 10 can be configured to test a significantly larger number of DUTs than a typical test system in a shorter amount of time. Specifically, because the tests that are conducted on the DUTs 14 are not conducted in parallel, such that they do not all start and finish at the same time, the number of DUTs 14 on which the tests are conducted can be maximized to account for variation in current draw from one test to another, or from one stage of a test to another. Therefore, the current that is provided from the DUT test system 12 can be maximized, thus resulting in greater efficiency of the test system 10 relative to a typical test system.

Figure 2:
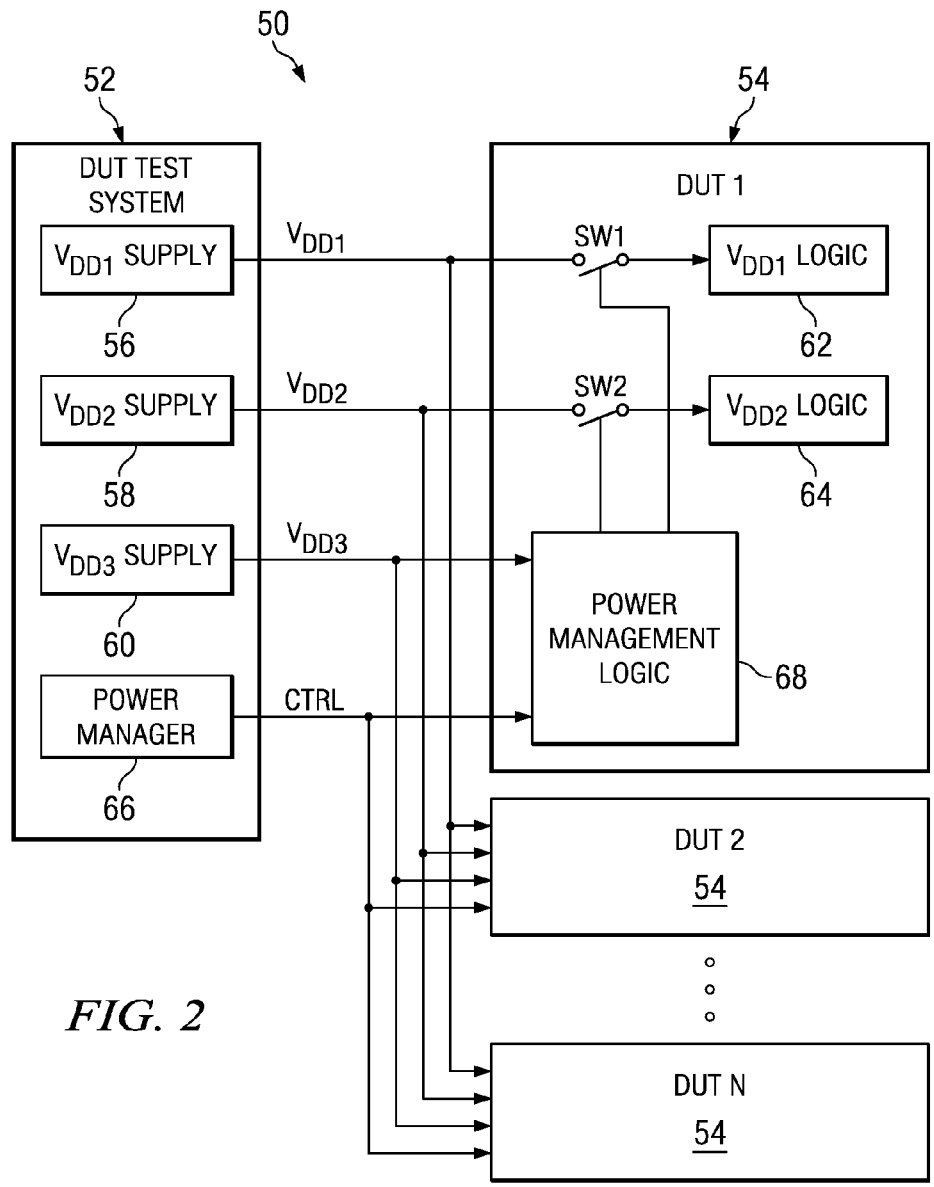
FIG. 2 illustrates another example of a test system in accordance with an aspect of the invention.

FIG. 2 illustrates another example of a test system 50 in accordance with an aspect of the invention. The test system 50 can be configured substantially similar to the test system 10 in the example of FIG. 1. Therefore, reference may be made to the example of FIG. 1 in the discussion of the example of FIG. 2.

The test system 50 includes a DUT test system 52 and a plurality of DUTs 54. Similar to as described above in the example of FIG. 1, the DUTs 54 can be any of a variety of electronic devices for which testing may be necessary prior to consumer distribution. For example, the DUTs 54 can be assorted semiconductor dies on a wafer or packaged ICs. In the example of FIG. 2, the DUTs 54 are labeled DUT 1 through DUT N, where N is a positive integer that is greater than one. As an example, the number N of DUTs 54 can be one-thousand or more. In addition, in the example of FIG. 2, the test system 50 does not include details regarding the exchange of stimuli and/or test data between the DUT test system 52 and the DUTs 54, as described above in the example of FIG. 1. However, it is to be understood that the DUT test system 52 can be configured to provide test stimuli, such as test programs and/or inputs, to the DUTs 54, and that the DUTs 54 can be configured to provide test data, such as responses and/or test results, to the DUT test system 52.

In the example of FIG. 2, the DUT test system 52 includes a first power supply 56 that is configured to provide a voltage $V_{DD1}$ to each of the DUTs 54. The DUT test system 52 also includes a second power supply 58 that is configured to provide a voltage $V_{DD2}$ to each of the DUTs 54, and a third power supply 60 that is configured to provide a voltage $V_{DD3}$ to each of the DUTs 54. The voltage $V_{DD1}$ is provided to each of the DUTs 54 to power $V_{DD1}$ logic 62, and the voltage $V_{DD2}$ is provided to each of the DUTs 54 to power $V_{DD2}$ logic 64. The voltage $V_{DD1}$ and the voltage $V_{DD2}$ can be different relative to each other. As an example, the $V_{DD1}$ logic 62 can be logic that is associated with inputs/outputs (I/O) of the DUTs 54, and the $V_{DD2}$ logic 64 can be logic that is associated with processing and/or other internal circuitry. Thus, in this example, the voltage $V_{DD1}$ can be greater than the voltage $V_{DD2}$. The voltages $V_{DD1}$ and $V_{DD2}$ can be provided by the DUT test system 52 to the DUTs 54 to conduct tests on both the $V_{DD1}$ logic 62 and the $V_{DD2}$ logic 64.

To manage the supplied power for the tests that are conducted on the DUTs 54, via the $V_{DD1}$ logic 62 and/or the $V_{DD2}$ logic 64, the DUT test system 52 includes a power manager 66, and each of the DUTs 54 includes power management logic 68. The voltage $V_{DD3}$ is provided to the power management logic 68 of each of the DUTs 54, such that the voltage $V_{DD3}$ can be a voltage that is specific to powering the power management logic 68. Similar to as described above in the example of FIG. 1, the power manager 66 can be configured to monitor the current that is drawn from the first power supply 56 and/or the second power supply 58 by the DUTs 54 during testing. If the monitored current exceeds a predetermined threshold that is set by the power manager 66, the power manager 66 can broadcast a control signal CTRL to all of the DUTs 54.

The control signal CTRL is received at the power management logic 68 of each of the DUTs 54. The control signal CTRL can include an alarm that indicates that the monitored current has exceeded the threshold, such that the power management logic 68 can implement an algorithm to decide if it should cancel the test that is associated with the $V_{DD1}$ logic 62 and/or the $V_{DD2}$ logic 64. As an example, the power management logic 68 can include a timer that is configured to increment while the respective DUT 54 conducts the test functions associated with the $V_{DD1}$ logic 62 and/or the $V_{DD2}$ logic 64. The control signal CTRL can thus include a time value that is provided to the power management logic 68 of each of the DUTs 54 in addition to the alarm. The time value can correspond to a time that is indicative of a duration of elapsed testing time below which a subset of the DUTs 54 should have their respective tests cancelled. Therefore, upon receiving the time value that is provided in the control signal CTRL, the power management logic 68 of each of the DUTs 54 compares the respective incremented value of the elapsed testing time with the time value. If the elapsed testing time is less than or equal to the time value, the power management logic 68 can determine to cancel the test for the respective DUT 54.

In the example of FIG. 2, the voltage $V_{DD1}$ is coupled to the $V_{DD1}$ logic 62 via a switch SW1, and the voltage $V_{DD2}$ is coupled to the $V_{DD2}$ logic 64 via a switch SW2. As an example, the switches SW1 and SW2 can be configured as solid-state switching devices (e.g., transistors). Upon determining that the test for the respective DUT 54 should be cancelled, the power management logic 68 can be configured to open the switch SW1 and/or the switch SW2 to decouple the voltage $V_{DD1}$ from the $V_{DD1}$ logic 62 and/or decouple the voltage $V_{DD2}$ from the $V_{DD2}$ logic 64. As a result, the $V_{DD1}$ logic 62 and/or the $V_{DD2}$ logic 64 are unable to complete their respective test, and thus no longer draw current from the first power supply 56 and the second power supply 58. Accordingly, the subset of the DUTs 54 having cancelled their respective tests reduces the total amount of current that is supplied by the respective first and second power supplies 56 and 58.

The time value that is broadcast to each of the DUTs 54 in the control signal CTRL can be adjusted by the power manager 66 from one broadcast to the next. For example, depending on the magnitude or the rate of increase of the monitored current beyond the predetermined threshold, the power manager 66 can adjust the time value that is broadcast in the control signal CTRL to command a greater or lesser number of the DUTs 54 to cancel their respective tests. For example, if the monitored current is only slightly greater than the predetermined threshold, the power manager 66 can set the time value to a small magnitude to cancel the tests for a small portion of the DUTs 54 in an attempt to maintain maximization of the supplied current to each of the DUTs 54. However, upon the monitored current rapidly increasing beyond the predetermined threshold, the power manager 66 can set the elapsed time to a large value to cancel the tests for a large portion of the DUTs 54 due to a large portion of the DUTs 54 not having achieved the testing time. As a result, a larger number of the DUTs 54 will cancel their respective tests because a smaller number of the DUTs 54 will have been conducting their respective tests for a time greater than the elapsed time. In addition, upon determining that the monitored current is still greater than the predetermined threshold after broadcasting the time value to the DUTs 54, the power manager 66 can retransmit the control signal CTRL with the same time value or a different (e.g., greater) time value. Furthermore, the power manager 66 can also be configured to set the predetermined threshold dynamically. As an example, the power manager 66 may set the predetermined threshold based on the dynamic current range for the currently conducted test or test stage for each of the DUTs 54, such that the predetermined threshold can be set lower for higher dynamic current range tests or test stages.

The power management logic 68 can also include logic that dictates when the switches SW1 and SW2 should be closed to restart the respective tests. As an example, the power management logic 68 can include a back-off timer that begins incrementing upon the cancellation of the tests, and thus the opening of the switches SW1 and/or SW2. Upon the back-off timer achieving a preset value, the power management logic 68 can close the switches SW1 and SW2, thus providing the voltages $V_{DD1}$ and $V_{DD2}$ to the $V_{DD1}$ logic 62 and the $V_{DD2}$ logic 64, respectively. The preset value of the back-off timer can be randomly determined, such that the DUTs 54 having cancelled their respective tests can restart at times separate from each other to control the amount of current drawn from the DUT test system 52. Therefore, the $V_{DD1}$ logic 62 and the $V_{DD2}$ logic 64 can restart their respective test functions. It is to be understood that implementing the restart capability of the subset of the DUTs 54 having cancelled tests in the power management logic 68 of the DUTs 54 can result in efficient communications between the DUT test system 52 and the DUTs 54. Specifically, by not sending a restart command from the DUT test system 52 to the DUTs 54 after canceling the tests for the subset of the DUTs 54, communications between the DUT test system 52 and the DUTs 54 can be significantly reduced in the non-parallel testing environment described herein.

In addition to the power management logic 68 generating the preset value for the closure of the switches SW1 and SW2, the control signal CTRL can also be provided to generate an additional predetermined delay that is resolved before the incrementation of the back-off timer. As an example, upon the power manager 66 in the DUT test system 52 determining that the monitored current has exceeded the threshold, the DUT test system 52 may also identify that the present test that is being conducted is very long in duration. As a result, the power manager 66 can provide the predetermined delay in the control signal CTRL, such that the DUTs 54 that are not currently conducting a test do not begin to increment their respective back-off timers until after the completion of the predetermined delay. As a result, the DUT test system 52 can exhibit more control over the number of DUTs that are running a test a given time, such that inefficient and/or counter-productive testing can be mitigated, or such that the predetermined threshold can be adjusted to a higher magnitude if necessary.

In addition to providing an alarm if the monitored current exceeds the predetermined threshold, the control signal CTRL can also be provided to the DUTs 54 to initiate a test sequence. Specifically, upon the DUT test system 52 establishing electrical contact with all of the DUTs 54, the DUT test system 52 can provide the control signal CTRL to initiate a test sequence for the DUTs 54. However, upon initiation of the test sequence of all of the DUTs 54, it may be impractical to begin the test functions of all of the DUTs 54 concurrently, as the inrush current draw of all of the DUTs 54 may immediately or very quickly cause the monitored current to exceed the predetermined current threshold.

To prevent an immediate alarm condition of the monitored current upon initiation of the test sequence, the power management logic 68 may include an additional random heuristic algorithm that is configured to stagger the start of the test functions of all of the DUTs 54. As an example, prior to the test sequence initiation, such as upon receiving power from the supply voltage $V_{DD3}$, the power management logic 68 may generate a random number corresponding to a start time. As an example, the random number could be from 0-3, with each value corresponding to a group of the DUTs 54 that initiate their respective test sequences concurrently. The DUT test system 52 could thus provide a sequence of test sequence initiation signals via the control signal CTRL, each of the test sequence initiation signals including a number corresponding to a set of the DUTs 54 having randomly selected the number to start testing. It is to be understood that the number corresponding to a start time for the DUTs 54 may be non-random, such that it could instead be preprogrammed at fabrication, or could be assigned by the DUT test system 52 upon application of the supply voltage $V_{DD3}$.

As an example, the DUT test system 52 could broadcast the control signal CTRL to all of the DUTs 54 with an indication for the DUTs 54 having selected the number 0 to start testing. At a later time, the DUT test system 52 could again broadcast the control signal CTRL to all of the DUTs 54, this time with an indication for the DUTs 54 having selected the number 1 to start testing, and so forth. As a result, the number of DUTs 54 that begin testing at one time is reduced, such that inrush current may not result in a substantially immediate alarm condition for the test system 50. In addition, because the DUTs 54 randomly select the number corresponding to the start time, communications between the DUT test system 52 and the DUTs 54 can further be reduced.

It is to be understood that the test system 50 is not intended to be limited to the example of FIG. 2. As an example, instead of including the $V_{DD1}$ logic 62 and the $V_{DD2}$ logic 64, each of the DUTs 54 can include a single logic block configured to conduct tests, or can include more than two logic blocks that are each separately coupled to one or more power supplies of the DUT test system 52. In addition, it is to be understood that for a given test or portion of a test, the $V_{DD1}$ logic 62 and the $V_{DD2}$ logic 64 can operate separately and independently of each other, or can operate in conjunction with each other. As a result, the control signal CTRL can be provided to command the subset of the DUTs 54 to open the switch SW1, the switch SW2, or both to disconnect the respective one or both of the $V_{DD1}$ logic 62 and the $V_{DD2}$ logic 64 depending on the given test or portion of test. As another example, it is to be understood that the DUTs 54 need not be configured identically, such that only a portion of the DUTs 54 include the power management logic 68, or that a portion of the DUTs 54 have separate logic blocks that may perform separate tests. Therefore, the test system 50 can be configured in any of a variety of ways.

Figure 3:
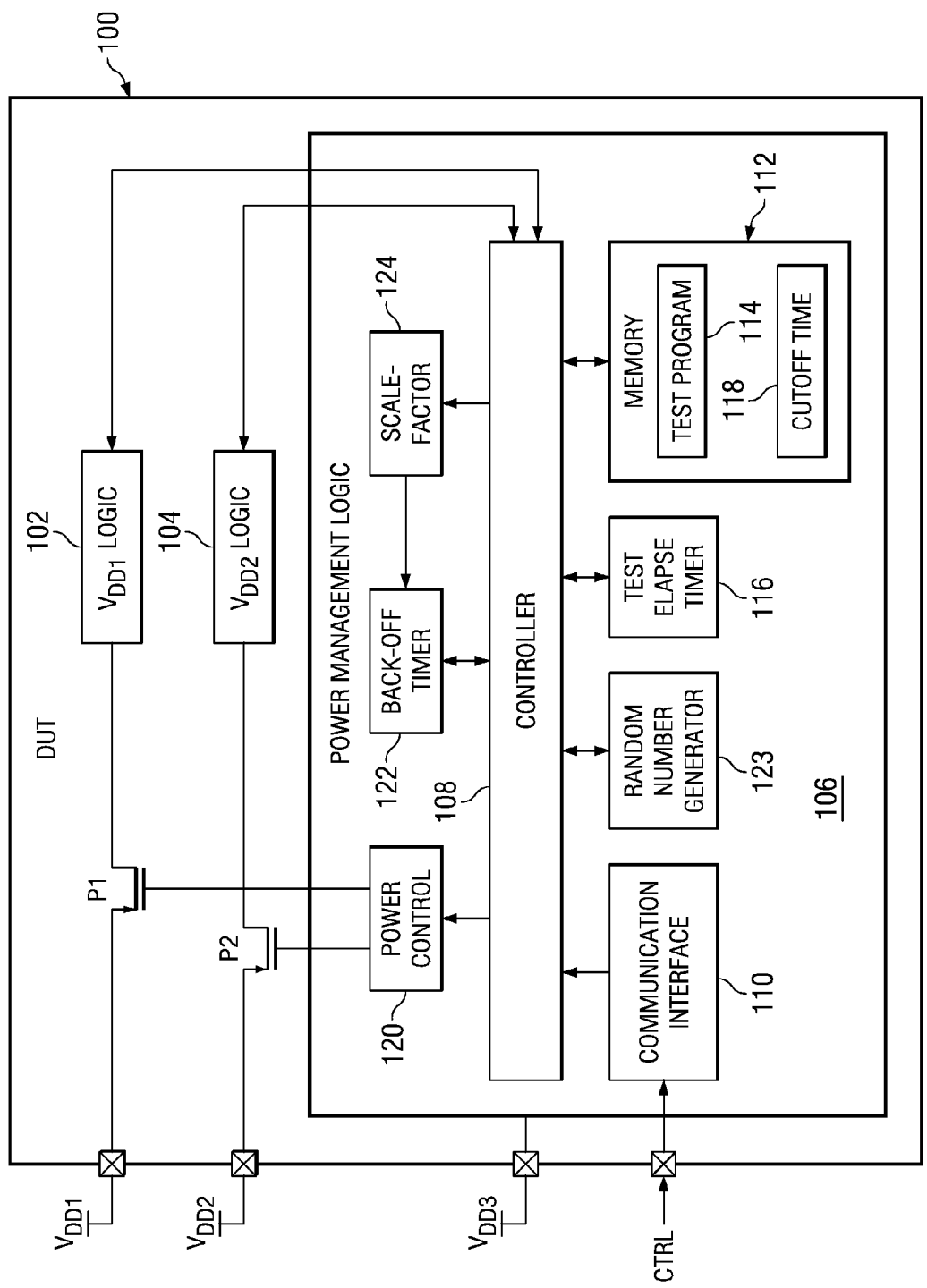
FIG. 3 illustrates an example of a device-under-test in accordance with an aspect of the invention.

FIG. 3 illustrates an example of a DUT 100 in accordance with an aspect of the invention. The DUT 100 can be configured substantially similar to the DUTs 54 in the example of FIG. 2. As such, reference is to be made to the test system 50 in the example of FIG. 2 in the discussion of the example of FIG. 3.

The DUT 100 includes $V_{DD1}$ logic 102 and $V_{DD2}$ logic 104. As an example, the $V_{DD1}$ logic 102 can be logic that is associated with I/O of the DUT 100, and the $V_{DD2}$ logic 104 can be logic that is associated with processing and/or other internal circuitry. In the example of FIG. 3, the $V_{DD1}$ logic 102 is powered by a supply voltage $V_{DD1}$ via a P-type field effect transistor (P-FET) P1, and the $V_{DD2}$ logic 104 is powered by a supply voltage $V_{DD2}$ via a P-FET P2. The supply voltage $V_{DD1}$ and the supply voltage $V_{DD2}$ can each be provided by a DUT test system (not shown), such as the DUT test system 52 in the example of FIG. 2, and can have different values relative to each other. The supply voltages $V_{DD1}$ and $V_{DD2}$ can thus be provided to the DUT 100 for test functions associated with the $V_{DD1}$ logic 102 and the $V_{DD2}$ logic 104, respectively.

The DUT 100 includes power management logic 106 that is powered by a supply voltage $V_{DD3}$, such as provided by the DUT test system 52. The power management logic 106 can be configured to operate in conjunction with the power manager 66 of the DUT test system 52 to control maximization and efficient use of a current flow associated with the supply voltages $V_{DD1}$ and $V_{DD2}$ for a set of DUTs, such as described above in the example of FIG. 2. Specifically, the power management logic 106 for the DUT 100 can be responsive to a control signal CTRL to determine when to cancel a test associated with the $V_{DD1}$ logic 102 and the $V_{DD2}$ logic 104, as well as when to restart a cancelled test. As a result, the test current provided to a set of DUTs that are configured substantially similar to the DUT 100 can be maximized to allow more efficient testing of the set of DUTs.

The power management logic 106 includes a controller 108. The controller 108 can be configured to control the power management functionality associated with the power management logic 106. Specifically, the controller 108 is configured to respond to broadcast commands and/or other signals provided from the DUT test system 52, and to thus determine when to cancel and restart the tests associated with the $V_{DD1}$ logic 102 and the $V_{DD2}$ logic 104. In addition, the controller 108 can be included in or associated with one or more other functions associated with the DUT 100, such as controlling the test functions, processing features associated with the $V_{DD1}$ logic 102 and the $V_{DD2}$ logic 104, and/or any of a variety of additional functions.

The controller 108 is coupled to a communication interface 110. In the example of FIG. 3, the communication interface 110 receives a control signal CTRL, such as provided by the DUT test system 52 in the example of FIG. 2, and is configured to provide the information within the control signal CTRL to the controller 108. In the example of FIG. 3, the communication interface 110 is demonstrated only as a receiver. However, it is to be understood that the communication interface 110 can also be configured as a transmitter to provide communications from the controller 108 to any of a variety of devices, such as the DUT test system 52. It is also to be understood that the control signal CTRL as well as any types of responses or communications to the DUT test system 52 from the DUT 100 can be communicated based on any of a variety of known or proprietary bus protocols. As an example, the DUT 100 can be configured to provide via the communication interface 110 responses to stimuli or an indication to the DUT test system 52 that it has a completed a test, or that a given test was a success or a failure. As yet another example, the communication interface 110 can be coupled to a serial communication bus, such that the DUT 100 can also communicate with other DUTs, such as neighboring DUTs on the wafer/tester. Therefore, the DUT 100 can determine whether other DUTs are conducting their respective tests, such that initialization and/or restart of tests can be conducted sequentially based on the communications of the DUTs with each other and/or with the DUT test system. In addition to receiving the control signal CTRL, the communication interface 110 can also receive information that is downloaded to the DUT 100, such as from the DUT test system 52. As an example, the DUT test system 52 can include a test program for the DUT 100 to run and conduct a respective test within the control signal CTRL.

The power management logic 106 includes a memory 112 that is coupled to the controller 108. The memory 112 can be configured as a cache memory, or as address registers within a memory space in the DUT 100. The memory 112 includes a test program 114 that is stored therein. As an example, the test program 114 can be a program that includes the test functions for the tests that are to be conducted by the $V_{DD1}$ logic 102 and the $V_{DD2}$ logic 104. Therefore, the test program 114 can be accessed by the controller 108 to provide commands and/or receive responses to and/or from the $V_{DD1}$ logic 102 and the $V_{DD2}$ logic 104, respectively. The test program 114 can also include multiple tests to be conducted sequentially, or can include a single test which can be overwritten with additional tests by the controller 108. As an example, the test program 114 can be downloaded from the DUT test system 52 through the communication interface 110 and stored within the memory 112 for subsequent access by the controller 108. Thus, additional programs can be downloaded and can overwrite the current test program 114 that is stored in the memory 112. As another example, the test program 114 can be hard-coded into the power management logic 106, such that the DUT 100 is fabricated with the test program 114 included.

Upon starting a test, the controller 108 initiates a test elapse timer 116. The test elapse timer 116 can be a timer that tracks a time duration that has elapsed for a given test or a given stage of a test. As an example, the incrementing value of the test elapsed timer 116 can be implemented to determine whether a given test has failed. For example, in the example of FIG. 3, the memory 112 includes a cutoff time 118. The cutoff time 118 can correspond to a predetermined time at which an elapsed time duration of given test past the cutoff time 118 indicates failure of the given test. Therefore, upon the incremented value of the test elapse timer 116 being greater than the cutoff time 118, the controller 108 can indicate failure of the given test. In addition, the DUT 100 can deactivate the P-FETs P1 and/or P2 to remove the respective voltages $V_{DD1}$ and $V_{DD2}$, therefore preventing the DUT 100 from drawing power based on it being a rejected part, and thus allowing other DUTs to receive the provided power for more efficient testing. The cutoff time 118 can be adjustable based on the test that is being conducted, such as through being downloaded from the DUT test system 52 via the communication interface 110.

In addition to using the test elapse timer 116 to identify failed tests, the controller 108 can also employ the test elapse timer 116 to determine whether to cancel a test for the DUT 100 to manage power for the test system in which the DUT 100 is included. As an example, the control signal CTRL can include an alarm that indicates that the current draw of the supply voltages $V_{DD1}$ and/or $V_{DD2}$ have exceeded a predetermined threshold value. The alarm could include a time value that can be utilized by the controller 108 to determine if the current test that is being run should be cancelled. As an example, upon receiving the alarm condition in the control signal CTRL, the controller 108 can compare the incremented time of the test elapse timer 116 with the time value that is included in the alarm. If the incremented time of the test elapse timer 116 is less than or equal to the time value, the controller 108 can cancel the test that is being conducted on the $V_{DD1}$ logic 102 and/or the $V_{DD2}$ logic 104. If incremented time of the test elapse timer 116 is greater than the time value, the controller 108 can take no action with regard to the alarm, as it would be inefficient to cancel the test functions of the $V_{DD1}$ logic 102 and/or the $V_{DD2}$ logic 104 at such a late stage in the test.

Upon determining that the test should be cancelled, the controller 108 can provide commands to a power control driver 120. The power control driver 120 can function as drivers to the P-FET P1 and the P-FET P2. Therefore, the controller 108 can provide deactivation commands to the power control driver 120, which can provide a logic-high signal to the P-FETs P1 and P2 to deactivate the P-FETs P1 and P2. Thus, the controller 108 can decouple the $V_{DD1}$ logic 102 and/or the $V_{DD2}$ logic 104 from the supply voltage $V_{DD1}$ and the supply voltage $V_{DD2}$, respectively, via the power control driver 120.

Similar to as described above in the example of FIG. 2, the power management logic 106 can be configured to include restart logic, such as based on executable instructions within the controller 108, that implements a random heuristic algorithm for restarting a test after the test has been cancelled. Specifically, in the example of FIG. 3, the power management logic 106 includes a back-off timer 122 that is configured to begin incrementing upon the cancellation of a test. In addition, upon the cancellation of a test, the controller 108 can be configured to set a random preset time value for the back-off timer 122 using a random number generator 123. Because the preset time value is random, the DUT 100 can restart the test independently of both the DUT test system 52 and other DUTs. Therefore, inrush current of the supply voltage $V_{DD1}$ and/or $V_{DD2}$ can be minimized based on the individual restart of the tests of the entire subset of DUTs that had cancelled their respective tests. The random number generator 123 can also be implemented to set a random number corresponding to a start time at the initiation of the test sequence by the DUT test system 52, such as described above in the example of FIG. 2.

The back-off timer 122 allows a test system that includes the DUT 100, such as the test system 50 in the example of FIG. 2, time to test other DUTs without the current draw associated with the testing of the $V_{DD1}$ logic 102 and/or the $V_{DD2}$ logic 104. However, because the preset time is randomly determined, and because the number of DUTs that have cancelled their respective tests at a given time may be unknown, it may be difficult to maintain efficient operation of the test system. As an example, for random preset times that are too short, the subset of the DUTs having cancelled the respective tests may restart too soon, thus forcing the DUT test system 52 to again command a subset of the DUTs to cancel tests, particularly those that had just restarted the tests. For random preset times that are too long, the DUT test system 52 may not be able to maximize the provided current to the DUTs, as too many of the DUTs may be waiting to restart tests. As a result, the DUT test system 52 may be configured to exhibit some control of the power management logic 106 to ensure more efficient power management.

In the example of FIG. 3, the power management logic 106 includes a scale-factor register 124. The scale-factor register 124 can be included in the memory 112, or can be included in a separate memory that is resident in the DUT 100. The scale-factor register 124 includes a scale-factor value that is provided to the DUT 100, such as from the DUT test system 52, to adjust the operation of the back-off timer 122. As an example, the DUT test system 52 can provide the scale-factor value to the DUT 100 as part of the alarm that is included in the control signal CTRL. The scale-factor value can adjust the incremented value of the back-off timer 122, such that the scale-factor value can control how quickly or slowly the back-off timer 122 increments. Alternatively, the scale-factor value can be applied to the randomly determined preset time. Therefore, the scale-factor value can be implemented to dynamically adjust the range of the random preset time value relative to real time. As a result, the DUT test system 52 can adjust the scale-factor value and provide it to the DUTs to maintain efficient testing under the constraint of the random heuristic algorithm of the power management logic 106 that is included in each of the DUTs.

It is to be understood that the DUT 100 is not intended to be limited to the example of FIG. 3. As an example, similar to as described above regarding the example of FIG. 2, the DUT 100 is not intended to be limited to including the $V_{DD1}$ logic 102 and the $V_{DD2}$ logic 104, but can include a single logic set or more than two logic sets. As such, the power management logic 106 can be configured to individually or collectively decouple each of the logic sets from one or more supply voltages. As another example, the controller 108 is not limited to inclusion in the power management logic 106, but can be a processing unit for the entire DUT 100. Therefore, the DUT 100 can be configured in any of a variety of ways.

Figure 4:
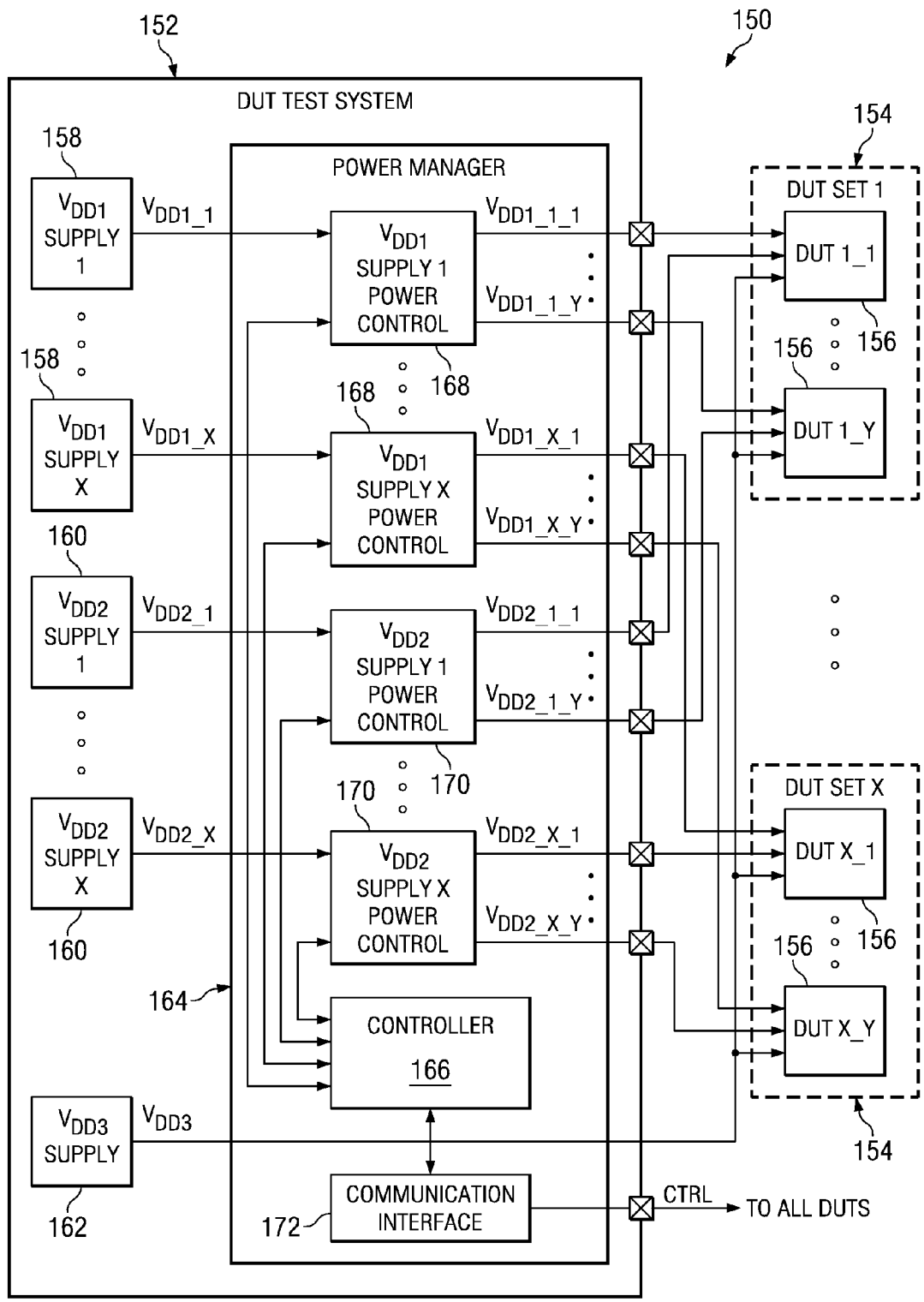
FIG. 4 illustrates another example of a test system in accordance with an aspect of the invention.

FIG. 4 illustrates another example of a test system 150 in accordance with an aspect of the invention. The test system 150 includes a DUT test system 152 and a plurality of DUTs. In the example of FIG. 4, the plurality of DUTs are arranged in a plurality of separate DUT sets 154, demonstrated as DUT SET 1 through DUT SET X, where X is a positive integer greater than one. Each of the DUT sets 154 includes a plurality Y of DUTs 156, where Y is a positive integer greater than one. Specifically, the DUTs 156 in the DUT SET 1 are demonstrated in the example of FIG. 4 as DUTs 1_1 through DUTs 1_Y, and the DUTs 156 in the DUT SET X are demonstrated as DUTs X_1 through DUTs X_Y. Each of the DUTs 156 in each of the DUT sets 154 can be representative of an individual DUT, or can be representative of a further smaller subset of DUTs within the respective DUT set 154, such as ten DUTs. In addition, it is to be understood that each of the DUT sets 154 can include the same or a different number of DUTs.

In the example of FIG. 4, the DUT test system 152 includes a plurality of first power supplies 158, labeled $V_{DD1}$ SUPPLY 1 through $V_{DD1}$ SUPPLY X, that are each configured to provide a respective voltage $V_{DD1\_1}$ through $V_{DD1\_X}$. The DUT test system 152 also includes a plurality X of second power supplies 160, labeled $V_{DD2}$ SUPPLY 1 through $V_{DD2}$ SUPPLY X, that are likewise each configured to provide a respective voltage $V_{DD1\_1}$ through $V_{DD2\_X}$. Each of the voltages $V_{DD1\_1}$ through $V_{DD1\_X}$ can be substantially equal to each other, and each of the voltages $V_{DD2\_1}$ through $V_{DD2\_X}$ can also be substantially equal to each other. Alternatively, different voltages can be provided at different outputs. The DUT test system 152 also includes a third power supply 162 that is configured to provide a voltage $V_{DD3}$ directly to each of the DUTs 156 in each of the DUT sets 154. As an example, the voltages $V_{DD1\_1}$ through $V_{DD1\_X}$ can each be implemented to provide power to a $V_{DD1}$ logic portion of each of the DUTs 156 in a corresponding DUT set 154, the voltages $V_{DD2\_1}$ through $V_{DD2\_X}$ can each be implemented to provide power to a $V_{DD2}$ logic portion of each of the DUTs 156 in a corresponding DUT set 154. The voltage $V_{DD3}$ can be implemented to provide power to a power management logic portion of all of the DUTs 156, similar to as described above in the examples of FIGS. 2 and 3. It is to be understood that, although the example of FIG. 4 demonstrates only a single power supply 162 to provide the voltage $V_{DD3}$, the DUT test system 152 can include a plurality of separate power supplies that are each configured to provide the voltage $V_{DD3}$, such as one for each of the respective DUT sets 154.

To manage the supplied power for the tests that are conducted on the DUTs 156, the DUT test system 152 includes a power manager 164. The power manager 164 includes a controller 166. The controller 166 can be configured to include a microprocessor and/or a memory, such as an application specific integrated circuit (ASIC), within the DUT test system 152 to provide processing capability with regard to the functions of the power manager 164. The controller 166 is coupled to a first plurality of supply power control devices 168 and a second plurality of supply power control devices 170. The first plurality of supply power control devices 168 each also receives the supply voltage $V_{DD1}$ from a respective one of the first power supplies 158, and are thus labeled $V_{DD1}$ SUPPLY 1 POWER CONTROL through $V_{DD1}$ SUPPLY X POWER CONTROL in the example of FIG. 4. Likewise, the second plurality of supply power control devices 170 each also receives the supply voltage $V_{DD2}$ from a respective one of the second power supplies 160, and are thus labeled $V_{DD2}$ SUPPLY 1 POWER CONTROL through $V_{DD2}$ SUPPLY X POWER CONTROL in the example of FIG. 4.

The supply power control devices 168 and 170 can each be configured to distribute the respective supply voltages to the DUTs 156 in each of the respective DUT sets 154. Specifically, as demonstrated in the example of FIG. 4, the $V_{DD1}$ SUPPLY 1 POWER CONTROL 168 provides supply voltages $V_{DD1\_1\_1}$ through $V_{DD1\_1\_Y}$ to each respective DUT 156 in DUT SET 1, and the $V_{DD1}$ SUPPLY X POWER CONTROL 168 provides supply voltages $V_{DD1\_1\_X}$ through $V_{DD1\_X\_Y}$ to each respective DUT 156 in DUT SET X. Similarly, the $V_{DD2}$ SUPPLY 1 POWER CONTROL 170 provides supply voltages $V_{DD2\_X\_Y}$ through $V_{DD2\_1\_Y}$ to each respective DUT 156 in DUT SET 1, and the $V_{DD2}$ SUPPLY X POWER CONTROL 170 provides supply voltages $V_{DD2\_X\_1}$ through $V_{DD2\_X\_Y}$ to each respective DUT 156 in DUT SET X. In addition, each of the supply power control devices 168 and 170 can include current monitoring and switching functionality. For example, the switching functionality can be implemented by the controller 166 operating one or more switch devices (e.g., transistor devices) to decouple a subset of the DUTs 156 from the respective one of the first power supplies 158 and/or the second power supplies 160.

As an example, the controller 166 can determine that a monitored current associated with one of the supply voltages $V_{DD1}$ or one of the supply voltages $V_{DD2}$ by a respective one of the supply power control devices 168 or 170 is excessive. In response to such a determination, the controller 166 can command the respective one of the supply power control devices 168 or 170 to deactivate all or a portion of all of the switches to decouple the DUTs 156 from the respective one of the first power supplies 158 and/or the second power supplies 160. As one example, excessive current through a portion of the DUTs 156 from the respective one of the power supplies 158 or 160 can result from a fabrication failure or a short-circuit caused by a tool misalignment, such as resulting in a short-circuit to ground. In such an example, the failure or short-circuit can be isolated to a specific subset of DUTs 156, thus allowing the remainder of the DUTs 156 to continue to be tested and validated.

As another example, the decoupling of a portion of the DUTs 156 from the respective one of the power supplies 158 or 160 can be included as part of the power management function of the power manager 164, such that current output from the power supplies 158 and 160 can be maximized for more efficient testing of a large set of DUTs 156. Therefore, the controller 166 can command the respective one of the supply power control devices 168 or 170 to deactivate a portion of the switches that couple the DUTs 156 to the respective one of the first power supplies 158 and/or the second power supplies 160 to cancel their respective tests, similar to as described above in the examples of FIGS. 1 through 3. In this example, the duration of elapsed test time of the subset of the DUTs 156 can be monitored by the controller 166 and/or the respective supply power control devices 168 or 170, or can be disregarded altogether. As another example, the controller 166 can communicate an alarm condition to the DUTs 156 via a control signal CTRL output from a communication interface 172. In response to the control signal CTRL, the DUTs 156 and the DUT test system 152 can include handshaking capability to determine which, if any, of the DUTs 156 are to be decoupled from the respective supply power voltages $V_{DD1}$ and $V_{DD2}$. Furthermore, the DUTs 156 can also include a random heuristic algorithm to determine a time to restart the test, similar to as described above in the examples of FIGS. 1 through 3.

Figure 5:
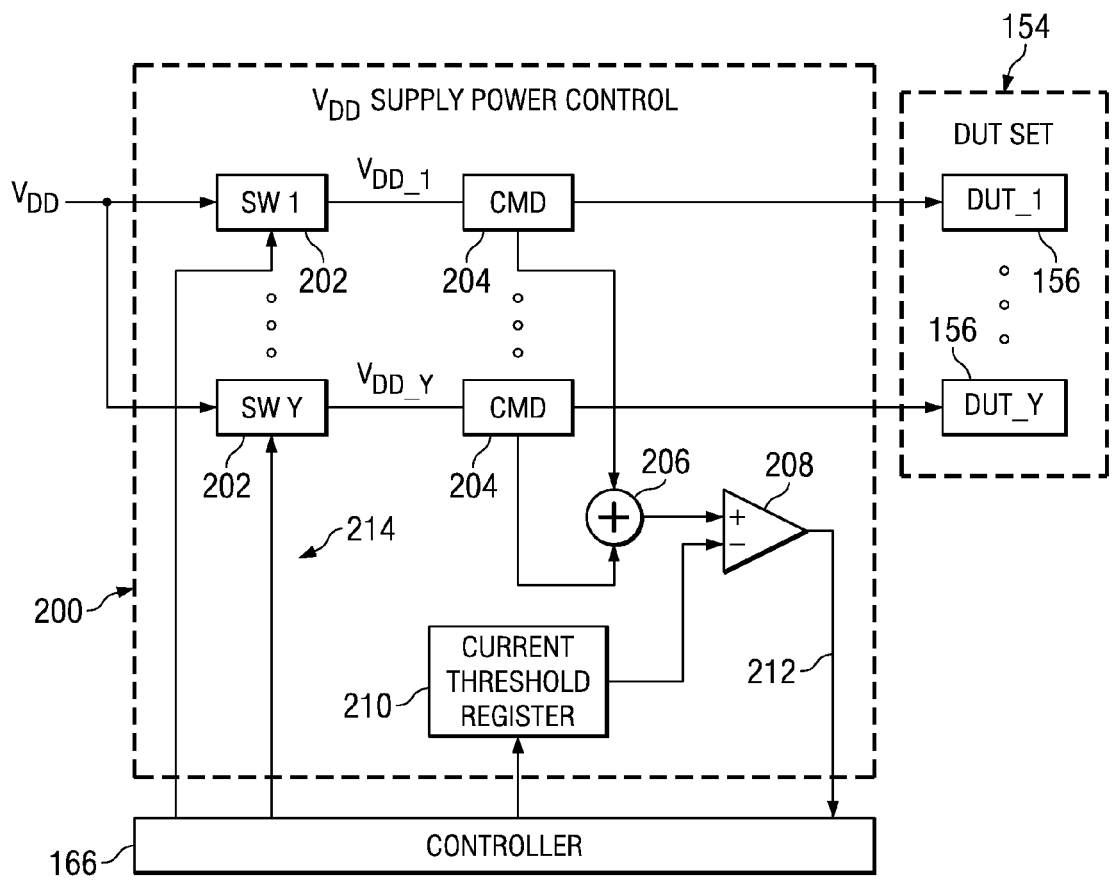
FIG. 5 illustrates an example of a supply power control device in accordance with an aspect of the invention.

FIG. 5 illustrates an example of a supply power control device 200 in accordance with an aspect of the invention. The supply power control device 200 can correspond to any of the power supply control devices 168 or 170 in the example of FIG. 4. Therefore, like reference numbers are used and reference is to be made to certain structures introduced in the example of FIG. 4 in the discussion of the example of FIG. 5.

The supply power control device 200 includes a plurality Y of switches 202, demonstrated as SW 1 through SW Y in the example of FIG. 5, where Y is a positive integer denoting the number of switches 202. Each of the switches 202 corresponds to a respective one of the DUTs 156 in a given DUT set 154, such that each of the switches 202 couples each of the DUTs DUT_1 through DUT_Y with a respective supply voltage $V_{DD1\_1}$ through $V_{DD\_Y}$. As described above in the example of FIG. 4, each of the DUTs 156 in the DUT set 154 can be representative of an individual DUT, or can be representative of a smaller subset of DUTs within the respective DUT set 154, such as ten DUTs. The supply voltage VDD can be any of the supply voltages provided from one of the power supplies 158 or 160, such as $V_{DD1\_1}$, $V_{DD1\_X}$, $V_{DD2\_1}$, $V_{DD2\_X}$, or any of the supply voltages between.

The supply power control device 200 includes a respective current monitoring device (CMD) 204 that is interconnected between each of the switches 202 and the respective DUTs 156. The CMDs 204 each monitors the current associated with the respective supply voltages $V_{DD\_1}$ through $V_{DD\_Y}$ and provides the current measurement to an adder 206. The CMDs 204 can be configured as any of a variety of current measuring devices, such as sense resistors. As an example, the CMDs 204 can be configured to measure a current associated with the respective supply voltage $V_{DD\_1}$ through $V_{DD\_Y}$, and provide a digital form of the measurement to the adder 206. The adder 206 is configured to add each of the measured currents of the CMDs 204 and provide a summation of the measured current to a comparator 208. The comparator 208 compares the summation of the measured current with a current threshold value that is stored in a current threshold register 210. As an example, the current threshold register 210 can be included in an address space within a memory in the DUT test system 152, or could be included in an address space within the controller 166.

The controller 166 can be configured to provide the current threshold value to the current threshold register 210, demonstrated in the example of FIG. 5 as being provided via a signal 211. As an example, the controller 166 can calculate and set the current threshold value based on the dynamic current range associated with the present test, such that the current threshold value can be set higher for lower dynamic current range tests and lower for higher dynamic current range tests. As an example, the controller 166 can provide the current threshold value corresponding to the higher dynamic current range tests via the signal 211 during the higher dynamic current range tests, such that the controller 166 can subsequently update the current threshold value via the signal 211 during the lower dynamic current range tests. As another example, the controller 166 can provide the current threshold values corresponding to both high dynamic current range tests and the low dynamic current range tests concurrently to the current threshold register 210. As a result, the controller 166 can implement the signal 211 as a trigger to switch between the two current threshold values at the current threshold register 210 based on the dynamic current range of the test that is conducted at a given time.

In addition, the current threshold value can be set individually for the supply power control device 200. As such, the current threshold value can be set at a different value for each of the supply power control devices 168 and 170 in the DUT test system 152. As a result, the current threshold value can be controlled for sets and subsets of the DUTs 156 to account for different tests that are running concurrently from one DUT to another, to account for different types of DUTs being tested concurrently, and/or to account for differences in a number of DUTs between each of the DUT sets 154.

Upon the summation of the measured current being greater than the current threshold value provided by the current threshold register 210, the comparator 208 provides to the controller 166 a comparator output signal 212 that defines an alarm condition. In response to the signal 212, the controller 166 can provide a deactivation signal 214 to one or more of the switches 202, such that one or more of the DUTs 156 are decoupled from the supply voltage $V_{DD}$. As a result, the tests for the respective one or more DUTs 156 are cancelled, and the current output from the power supply 158 or 160 that provides the supply voltage $V_{DD}$ is reduced accordingly. As described above, the controller 166 and/or the supply power control device 200 can track an elapsed time that the DUTs 156 have run the respective tests, such as through communication with the DUTs 156. As another example, the selection of the switches 202 to be deactivated, and thus the subset of DUTs 156 for which the tests are to be cancelled, can be arbitrarily determined by the controller 166. For example, the controller 166 can determine a number of switches 202 to be deactivated based on the magnitude of the monitored current relative to the predetermined threshold, and can thus select the specific switches 202 for activation based on a variety of other factors, such as an amount of time since the last deactivation of each given switch 202. As described in greater detail below, the deactivation of one or more switches 202 can be a short pulse, such that the DUTs 156 that are briefly decoupled from the respective supply voltage $V_{DD}$ via a switch 202 can set a subsequent time at which to restart the respective test independent of the DUT test system 152. Alternatively, the one or more switches 202 could remain deactivated for a predetermined amount of time.

It is to be understood that the supply power control device 200 is not intended to be limited to the example of FIG. 5. For example, the supply power control device 200 may not include the adder 206, or may include additional adders for summing currents. Therefore, the controller may be configured to receive and compare measured currents from each of the CMDs 204, or from less than all of the CMDs 204. As another example, the supply power control device may include only a single CMD 204 that is configured to monitor the current directly from the respective first or second power supply 158 or 160 prior to the switches 202. Therefore, the supply power control device 200 can be configured in any of a variety of ways.

Figure 6:
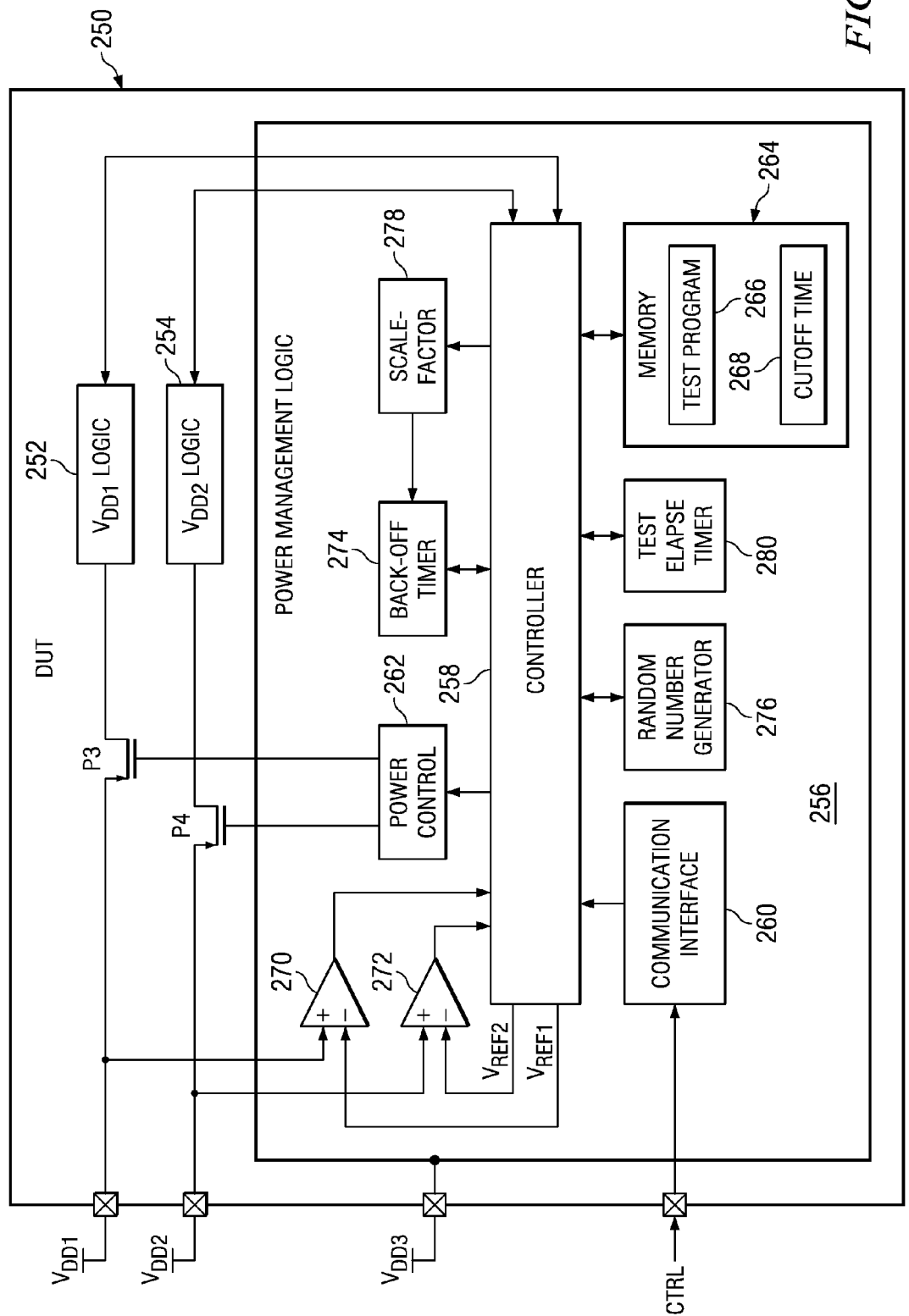
FIG. 6 illustrates another example of a device-under-test in accordance with an aspect of the invention.

FIG. 6 illustrates another example of a DUT 250 in accordance with an aspect of the invention. The DUT 250 can be configured substantially similar to the DUTs 156 in the examples of FIGS. 4 and 5. As such, reference is to be made to the test system 150 and/or the supply power control device 200 in the examples of FIGS. 4 and 5, respectively, in the discussion of the example of FIG. 6.

The DUT 250 includes $V_{DD1}$ logic 252 that is powered by a supply voltage $V_{DD1}$ via a P-FET P3 and $V_{DD2}$ logic 254 that is powered by a supply voltage $V_{DD2}$ via a P-FET P4, similar to the DUT 100 in the example of FIG. 3. As an example, the $V_{DD1}$ logic 252 can be coupled to one of the first power supplies 158 via a respective one of the $V_{DD1}$ supply power control devices 168, and the $V_{DD2}$ logic 254 can be coupled to one of the second power supplies 160 via a respective one of the $V_{DD2}$ supply power control devices 170. In addition, the DUT 250 includes power management logic 256 that is powered by a supply voltage $V_{DD3}$, such as provided by the third power supply 162. The power management logic 256 can include a controller 258 that is coupled to the $V_{DD1}$ logic 252 and $V_{DD2}$ logic 254, similar to the DUT 100 in the example of FIG. 3. The power management logic 256 can also include a communication interface 260, a power control driver 262, and a memory 264 that includes a test program 266 and a cutoff time 268, also similar to the DUT 100 in the example of FIG. 3. The functionality of the power management logic 256 with regard to these components can thus be substantially similar to as described above in the example of FIG. 3.

The power management logic 256 also includes a first comparator 270 and a second comparator 272. The first comparator 270 is configured to compare the supply voltage $V_{DD1}$ with a reference voltage $V_{REF1}$ that is provided from the controller 258. Similarly, the second comparator 272 is configured to compare the supply voltage $V_{DD2}$ with a reference voltage $V_{REF2}$ that is provided from the controller 258. Each of the first comparator 270 and the second comparator 272 provide respective output signals to the controller 258. Therefore, the first comparator 270 and the second comparator 272 can, based on the comparison, each provide an indication to the controller 258 of whether the DUT 250 has been removed from the supply voltage $V_{DD1}$ and/or the supply voltage $V_{DD2}$, respectively.

For example, upon the controller 166 of the DUT test system 152 determining that the current associated with a first power supply 158 and/or a second power supply 160 has exceeded the current threshold value stored in the respective current threshold register 210, the controller 166 can deactivate a respective switch 202. As a result, the supply voltage $V_{DD1}$ and the supply voltage $V_{DD2}$ that are provided to the DUT 250 may be reduced to a magnitude that is approximately zero. In response, the first comparator 270 and/or the second comparator 272 provide an indication to the controller 258 of the DUT 250 that power has been removed by the DUT test system 152. Because the $V_{DD1}$ logic 252 and/or the $V_{DD2}$ logic 254 has been decoupled from the respective supply voltage $V_{DD1}$ and/or $V_{DD2}$, the test corresponding to the $V_{DD1}$ logic 252 and/or the $V_{DD2}$ logic 254 is effectively cancelled. In response to the output signals of the first comparator 270 and/or the second comparator 272, the controller 258 can deactivate the P-FET P3 and/or the P-FET P4 via the power control driver 262. The controller 258 can also randomly determine a preset time and begin incrementing a back-off timer 274, such as using a random number generator 276, similar to as described above with regard to the DUT 100 in the example of FIG. 3. The back-off timer 274 can be scaled by a scale-factor value that is stored in a scale-factor register 278, such as received from a control signal CTRL via the communication interface 260.

Similar to as described above regarding the DUT 100 in the example of FIG. 3, the DUT 250 can be configured to restart the tests corresponding to the $V_{DD1}$ logic 252 and/or the $V_{DD2}$ logic 254 independently of the DUT test system 152. Specifically, the controller 166 of the DUT test system 152 can only momentarily deactivate the respective switch 202 to remove the supply voltage $V_{DD1}$ and/or $V_{DD2}$ from the DUT 250. The supply voltage $V_{DD1}$ and/or the supply voltage $V_{DD2}$ can be immediately re-coupled to the DUT 250, such as prior to the incremented value of the back-off timer 274 achieving the random preset value. However, because the controller 258 of the DUT 250 deactivates the P-FET P3 and/or the P-FET P4 in response to the output signals of the first comparator 270 and/or the second comparator 272, the supply voltages $V_{DD1}$ and/or $V_{DD2}$ are not reapplied to the $V_{DD1}$ logic 252 and/or the $V_{DD2}$ logic 254 until the respective P-FET P3 and/or P-FET P4 have been reactivated by the controller 258. Such a reactivation occurs based on the back-off timer 274. For example, the DUT 250 can determine a time to reapply the supply voltages $V_{DD1}$ and/or $V_{DD2}$ to the $V_{DD1}$ logic 252 and/or the $V_{DD2}$ logic 254, which defines when the respective corresponding tests are to be restarted, based on the incremented value of the back-off timer 274 achieving the preset value, similar to as described above in the example of FIG. 3.

It is to be understood that the DUT 250 is not intended to be limited to the example of FIG. 6. As an example, similar to as described above regarding the example of FIG. 3, the DUT 250 is not intended to be limited to including the $V_{DD1}$ logic 252 and the $V_{DD2}$ logic 254, but can include a single logic set or more than two logic sets. As such, the power management logic 256 can be configured to individually or collectively decouple each of the logic sets from one or more supply voltages. As another example, the first comparator 270 and the second comparator 272 are not limited to monitoring magnitudes of the supply voltages $V_{DD1}$ and $V_{DD2}$, respectively, of approximately zero. Specifically, the controller 258 can adjust the values of $V_{REF1}$ and $V_{REF2}$ individually to any of a variety of values, such that if either of the supply voltages $V_{DD1}$ and $V_{DD2}$ is reduced to an unacceptable magnitude for testing, the controller 258 can cancel a respective test for the $V_{DD1}$ logic 252 and/or the $V_{DD2}$ logic 254. Furthermore, the DUT 250 can include a test elapse timer 280, similar to the DUT 100 in the example of FIG. 3. As a result, the DUT 250 can also receive alarm commands from the DUT test system 152 via the control signal CTRL to cancel a test, in addition to a test being cancelled in response to the removal of supply power. Furthermore, the DUT 250 can provide handshaking to the DUT test system 152 to provide an indication to the DUT test system 152 of an elapsed time of testing, such that the DUT test system 152 can determine whether to remove power from the DUT 250 via one or more switches 202 based on the incremented value of the test elapse timer 280. As an example, the DUT 250 can transmit an indication that the test elapse timer has exceeded a time value broadcast from the DUT test system 152, thus indicating to the DUT test system 152 to not select the DUT 250 for test cancellation. Accordingly, the DUT 250 can be configured in any of a variety of ways based on the teachings herein.

As described above in the example of FIG. 4, the DUT test system 152 can be configured to adjust the predetermined threshold for a given power supply 158 and 160 based on a dynamic current range for a given test or test stage. As described herein, dynamic current range is defined as high or low based on an amount of current that is drawn by the DUTs 156. For example, a test can be considered to have a high dynamic-range if the test requires a high rate of change of current draw or a significantly high amount of current draw. Therefore, the DUT test system 152 can determine a magnitude for the predetermined threshold current relative to a current limit based on an amount or rate at which the current can change for a given test or test stage. As an example, in order to maximize the supplied current to the DUTs 156 during a test that includes a relatively low dynamic-range, the DUT test system 152 may set the predetermined threshold for the current at a value that is greater than a predetermined threshold value that can be set for a test that includes a relatively high dynamic-range.

Figure 7:
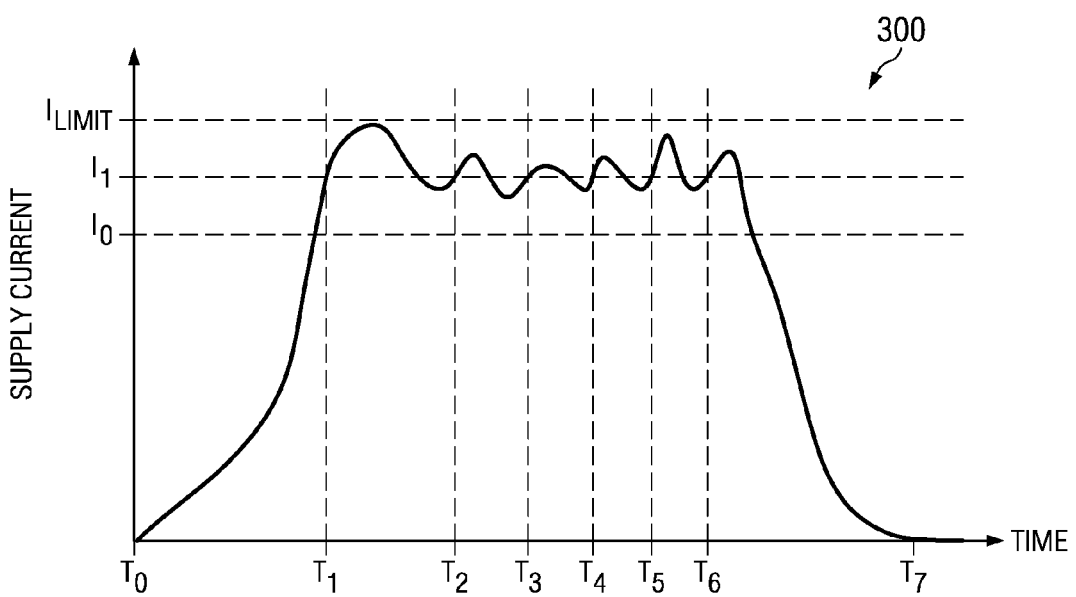
FIG. 7 illustrates an example of a supply current graph in accordance with an aspect of the invention.

FIG. 7 illustrates an example of a supply current graph 300 in accordance with an aspect of the invention. The supply current graph 300 plots supply current as a function of time. The supply current can be a current that is associated with one of the first power supplies 158 or the second power supplies 160. The supply current graph 300 demonstrates three different magnitudes for the supply current, namely $I_0$, $I_1$, and $I_{LIMIT}$. The current $I_{LIMIT}$ can be a maximum current supply for the respective first power supply 158 or second power supply 160, and thus a current magnitude at which the current draw of the DUTs 156 cannot exceed. The current $I_0$ can be a first current threshold that is associated with a high dynamic-range test, and the current $I_1$ can be a second current threshold that is associated with a low dynamic-range test. In the example of FIG. 7, it is to be understood that the test conducted is a low dynamic-range test, such that the DUT test system 152 has set the predetermined threshold at the current $I_1$.

At a time $T_0$, the test sequence is initiated, and the supply current begins to increase. The start of the tests of the DUTs 156 can be staggered. As an example, each DUT 156 could generate a random delay time from initiation of the test sequence and use a respective back-off timer to begin testing.

As another example, each DUT 156 could generate a random sequence number corresponding to a start time, such that the DUT test system 152 could broadcast start times for each of the sequences corresponding to the random numbers. At a time $T_1$, the supply current exceeds the current $I_1$, and thus exceeds the predetermined current threshold. Therefore, the DUT test system 152 cancels the tests of a subset of the DUTs 156. For example, at the time $T_1$, the DUT test system 152 deactivates switches, such as the switches 202 in the example of FIG. 5, to decouple the subset of the DUTs 156 from the power, thus canceling the respective tests. As another example, at the time $T_1$, the DUT test system 152 broadcasts a control signal CTRL with a time value, such that the DUTs 156 that have been conducting their tests for an elapsed time less than or equal to the time value cancel their respective tests independently of the DUT test system 152. The DUTs 156 that have time values greater than the elapsed time value continue their respective tests.

At each of times $T_2$, $T_3$, $T_4$, $T_5$, and $T_6$, the supply current again increases above the current $I_1$, and thus above the predetermined threshold. As an example, the supply current can decrease as a result of cancelled tests, but can then subsequently increase based on the restart of testing of certain DUTs in the subset of DUTs 156 having cancelled the respective tests. After the time $T_6$, the supply current steadily decreases as more of the DUTs 156 finish the respective tests. Finally, at a time $T_7$, the test sequence is finished upon the supply current being reduced to zero, thus indicating that all of the DUTs 156 have finished the respective tests. Thus, at the time $T_7$, all of the DUTs 156 have finished their respective tests in an efficient manner, such that the tests are performed in a timely manner and with maximization of the DUT test system current.

Figure 8:
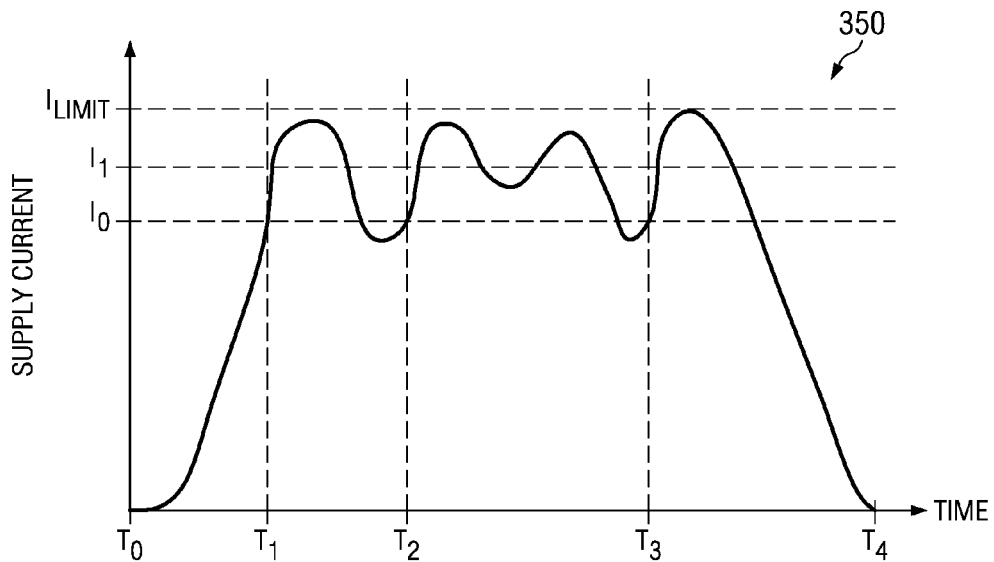
FIG. 8 illustrates another example of a supply current graph in accordance with an aspect of the invention.

FIG. 8 illustrates an example of a supply current graph 350 in accordance with an aspect of the invention. Similar to the example of FIG. 7, the supply current graph 350 plots supply current as a function of time, and the supply current can be a current that is associated with one of the first power supplies 158 or the second power supplies 160. The supply current graph 350 demonstrates the three different magnitudes for the supply current. The current $I_{LIMIT}$ can be a maximum current supply for the respective first power supply 158 or second power supply 160, and thus a current magnitude at which the current draw of the DUTs 156 cannot exceed. The current $I_0$ can be a first current threshold that is associated with a high dynamic-range test, and the current $I_1$ can be a second current threshold that is associated with a low dynamic-range test. In the example of FIG. 8, the current magnitudes for the currents $I_{LIMIT}$, $I_0$, and $I_1$ can be substantially the same as those in the example of FIG. 7. However, in the example of FIG. 8, it is to be understood that the test conducted is a high dynamic-range test, such that the DUT test system 152 has set the predetermined threshold at the current $I_0$.

At a time $T_0$, the test sequence is initiated, and the supply current begins to increase. The start of the tests of the DUTs 156 can be staggered. As an example, each DUT 156 could generate a random delay time from initiation of the test sequence and use a respective back-off timer to begin testing. As another example, each DUT 156 could generate a random sequence number corresponding to a start time, such that the DUT test system 152 could broadcast start times for each of the sequences corresponding to the random numbers. At a time $T_1$, the supply current exceeds the current $I_0$, and thus exceeds the predetermined current threshold for the high-dynamic range tests. Therefore, the DUT test system 152 cancels the tests of a subset of the DUTs 156. For example, at the time $T_1$, the DUT test system 152 deactivates switches, such as the switches 202 in the example of FIG. 5, to decouple the subset of the DUTs 156 from the power, thus canceling the respective tests. As another example, at the time $T_1$, the DUT test system 152 broadcasts a control signal CTRL with a time value, such that the DUTs 156 that have been conducting their tests for an elapsed time less than or equal to the time value cancel their respective tests independently of the DUT test system 152. The DUTs 156 that have time values greater than the elapsed time value continue their respective tests.

At each of times $T_2$ and $T_3$, the supply current again increases above the current $I_0$, and thus above the predetermined threshold. As an example, the supply current can decrease as a result of cancelled tests, but can then subsequently increase based on the restart of testing of certain DUTs in the subset of DUTs 156 having cancelled the respective tests. After the time $T_3$, the supply current steadily decreases as more of the DUTs 156 finish the respective tests. Finally, at a time $T_4$, the test sequence is finished upon the supply current being reduced to zero, thus indicating that all of the DUTs 156 have finished the respective tests. Thus, at the time $T_4$, all of the DUTs 156 have finished their respective tests in an efficient manner, such that the tests are performed in a timely manner and with maximization of the DUT test system current.

As demonstrated in the example of FIG. 8, the rate of increase of the supply current can be significantly greater in the high dynamic-range test than in the low dynamic-range test, as demonstrated in the example of FIG. 7. Therefore, the predetermined current threshold in the high dynamic-range tests can be set lower relative to low dynamic-range tests to account for rapid changes in the supply current that could push the supply current above the maximum current limit $I_{LIMIT}$. It is to be understood, however, that the tests that are running on the DUTs 156 may be different kinds of tests relative to each other at a given time. For example, some of the DUTs 156 may be conducting low dynamic-range tests at the same time that other DUTs 156 are conducting high dynamic-range tests. As a result, the DUT test system 152 can set the predetermined current threshold at a level that accounts for the portion of the DUTs 156 that are conducting high dynamic-range tests relative to low dynamic-range tests. For example, the DUT test system 152 can set a dynamic current-range weight to each of the DUTs 156 that are conducting the high dynamic-range tests and a different (e.g., lesser) dynamic-range weight to each of the DUTs 156 that are conducting low dynamic-range tests. As a result, the DUT test system 152 can calculate an average for the predetermined current threshold based on the dynamic current-range weights associated with each of the DUTs 156.

Figure 9:
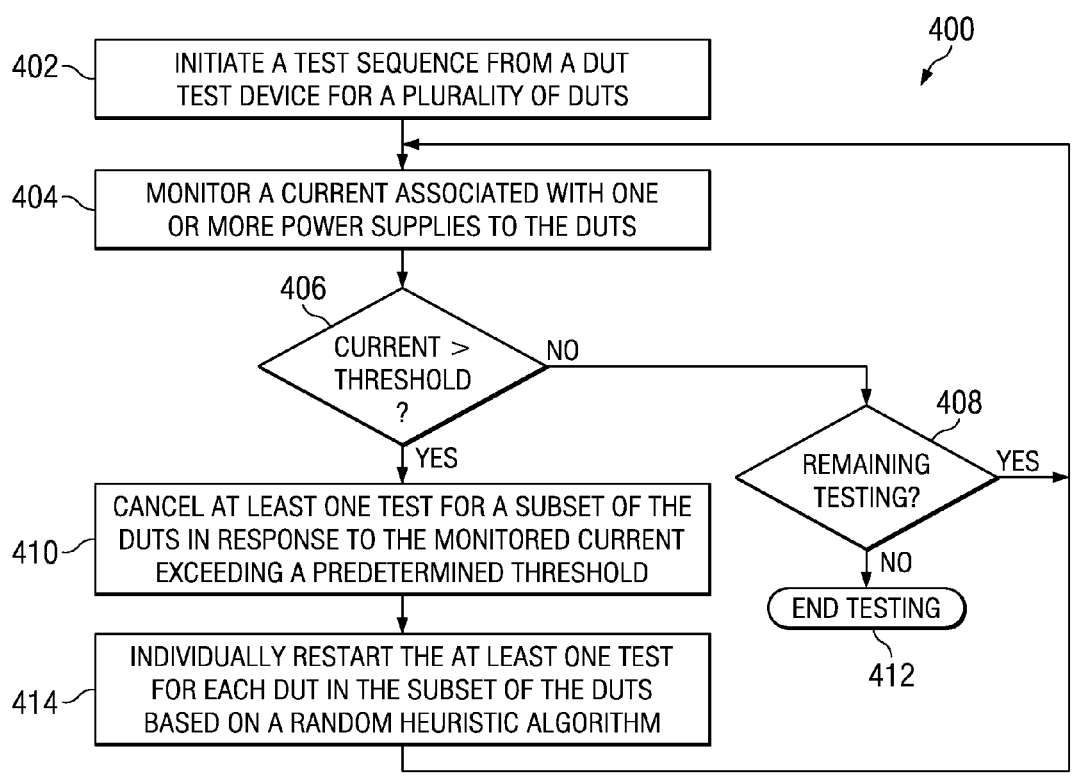
FIG. 9 illustrates an example of a method for managing power to a plurality of devices-under-test in accordance with an aspect of the invention.

In view of the foregoing structural and functional features described above, certain methods will be better appreciated with reference to FIG. 9. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit), software (e.g., as executable instructions stored in memory or running on one or more computer systems), or any combination of hardware and software.

FIG. 9 illustrates an example of a method 400 for managing power to a plurality of DUTs in accordance with an aspect of the invention. At 402, a test sequence is initiated by a DUT test system for the plurality of DUTs. The test sequence initiation can be staggered by the DUT test system. The staggering can be based on a random number selected by each of the DUTs, with the random number corresponding to a start time that is sequentially broadcast by the DUT test system. At 404, a current associated with one or more power supplies to the DUTs is monitored. The power supplies can be distributed amongst the plurality of DUTs, such that the current can be individually monitored for each.

At 406, the method determines if the current has exceeded the predetermined threshold. The determination can be based on CMDs associated with each of the supply voltages within the DUT test system. If NO, the current has not exceeded the predetermined threshold, the method proceeds to 408. If YES, the current has exceeded the predetermined threshold, the method proceeds to 410. At 408, the method determines if there are remaining tests to be conducted, such as based on DUTs that have not begun their respective tests or are still conductive their respective tests. If YES, there are tests that still remain, then the method returns to 404. If NO, there are no remaining tests, then the test sequence that was initialized at 402 is complete. The method thus proceeds to 412, at which the testing, and thus the method, ends.

At 410, at least one test is cancelled for a subset of the DUTs in response to the current exceeding a predetermined threshold. The predetermined threshold can be set based on the dynamic current range of the tests conducted on the DUTs. The cancellation of the test can be in response to a broadcast signal from the DUT test system, or can be based on the DUT test system removing power from the subset of the DUTs. The broadcast signal can include a time value, such that DUTs that have been conducting their respective tests for an elapsed time less than the time value cancel their respective test independently of the DUT test system. At 414, the at least one test is individually restarted for each DUT in the subset of the DUTs based on a random heuristic algorithm. Each of the DUTs can generate a random preset time and can begin incrementing a back-off timer upon canceling the tests. Upon the incremented value of the back-off timer being equal to the preset time, each of the DUTs can respectively restart the test. The method then returns to 404, at which the current associated with one or more power supplies to the DUTs is monitored.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system for managing power to a plurality of devices-under-test (DUTs), the system comprising:
a DUT test system configured to perform at least one test associated with operation of the DUTs and to monitor current associated with the at least one test of the plurality of DUTs, the DUT test system communicating an instruction to a subset of the plurality of DUTs to cancel the at least one test if the monitored current is greater than a predetermined threshold, each of the plurality of DUTs comprising logic configured to restart the at least one test of the subset of the plurality of DUTs after being cancelled in response to the instruction.

2. The system of claim 1, wherein each of the plurality of DUTs comprises power management logic that is configured to disconnect at least one power voltage in response to a broadcast command provided from the DUT test system upon the current being greater than the predetermined threshold.

3. The system of claim 2, wherein each of the plurality of DUTs also comprises a test elapse timer that increments during the at least one test, and wherein the broadcast command from the DUT test system comprises a time value, each of the plurality of DUTs having an incremented value of the test elapse timer that is less than the time value being included in the subset of the plurality of DUTs.

4. The system of claim 3, wherein each of the plurality of DUTs includes a predetermined cutoff time, such that the power management logic is configured to disconnect the at least one power supply voltage in response to the incremented value of the test elapse timer exceeding the predetermined cutoff time.

5. The system of claim 1, wherein each of the plurality of DUTs comprises a back-off timer configured to activate in response to the instruction to cancel the at least one test, each of the subset of the plurality of DUTs being configured to restart the at least one test in response to the back-off timer achieving a preset time value.

6. The system of claim 5, wherein the preset time value is randomly selected in response to a broadcast command from the DUT test system upon the current being greater than the predetermined threshold.

7. The system of claim 6, wherein the broadcast command from the DUT test system comprises a scale-factor, each of the plurality of DUTs being configured to apply the scale-factor to a respective back-off timer to adjust a random timing range of the respective back-off timer.

8. The system of claim 6, wherein the broadcast command comprises a predetermined delay time, the back-off timer being configured to begin incrementing upon expiration of the predetermined delay time.

9. The system of claim 1, wherein the DUT test system comprises a plurality of power supplies and a plurality of switches, each of the plurality of switches being configured to couple at least one of the plurality of DUTs to a respective one of the plurality of power supplies.

10. The system of claim 9, wherein the DUT test system is configured to control at least one of the plurality of switches to disconnect at least one of the DUTs from a respective one of the plurality of power supplies upon the current being greater than the predetermined threshold to select the subset of the plurality of DUTs, the subset of the plurality of DUTs being configured to individually determine a time when to restart the at least one test in response to detecting being disconnected from the respective one of the plurality of power supplies.

11. The system of claim 9, wherein the DUT test system is configured to individually monitor the current for each of the plurality of power supplies.

12. The system of claim 1, wherein the DUT test system is further configured to programmably set the predetermined threshold as a function of a dynamic current range of the at least one test.

13. The system of claim 1, wherein the plurality of DUTs are configured to generate a random number upon initiation of the at least one test by the DUT test system, the random number corresponding to a time at which a portion of the plurality of DUTs concurrently begin the at least one test.

14. A method for managing power to a plurality of devices-under-test (DUTs), the method comprising:
monitoring a current associated with at least one test of each of the plurality of DUTs;

canceling the at least one test for a subset of the plurality of DUTs in response to the current exceeding a predetermined threshold; and individually restarting the at least one test for the subset of the plurality of DUTs based on a random heuristic algorithm.

15. The method of claim 14, further comprising activating a back-off timer for each of the DUTs in the subset of the plurality of DUTs in response to canceling the at least one test, wherein individually restarting comprises individually restarting the at least one test for each of the DUTs in the subset of the plurality of DUTs upon the respective back-off timer achieving a respective random preset time value that is defined by the random heuristic algorithm.

16. The method of claim 15, further comprising setting a scale-factor to adjust a random timing range of the back-off timer for the plurality of DUTs.

17. The method of claim 14, further comprising:
incrementing a test elapse timer for each of the plurality of DUTs upon each of the plurality of DUTs initiating the at least one test;
broadcasting a time value to each of the plurality of DUTs if the current exceeds the predetermined threshold; and
selecting each of the DUTs of the plurality of DUTs having an incremented value of the test elapse timer that is less than the broadcasted time value to be in the subset of the plurality of DUTs.

18. The method of claim 14, wherein monitoring the current comprises monitoring a current associated with each of a plurality of portions of the plurality of DUTs, and wherein canceling the at least one test comprises decoupling power from a subset of a respective one of the plurality of portions of the plurality of DUTs upon the current of the respective one of the plurality of portions of the plurality of DUTs exceeding the predetermined threshold.

19. The method of claim 14, further comprising programmably setting the predetermined threshold as a function of a dynamic current range of the at least one test.

20. A system for managing power to a plurality of devices-under-test (DUTs), the system comprising:
means for monitoring a test current associated with at least one test of each of the plurality of DUTs;
means for removing the test current from a subset of the plurality of DUTs upon the test current exceeding a predetermined threshold; and
means for selecting the subset based on an elapsed time that each of the plurality of DUTs has individually performed the at least one test.

21. The system of claim 20, further comprising means for independently re-applying the test current for each DUT in the subset of the plurality of DUTs.

22. The system of claim 20, further comprising means for providing the test current to a respective portion of the plurality of DUTs, wherein the means for monitoring the test current comprises respective means for monitoring the test current associated with the respective one of the plural means for providing, and wherein the means for removing the test current comprises means for removing the test current from a subset of the respective portion of the plurality of DUTs upon a respective test current exceeding the predetermined threshold.

* * * * *